US007438560B2

(12) United States Patent
Takahashi

(10) Patent No.: US 7,438,560 B2
(45) Date of Patent: Oct. 21, 2008

(54) PRINTED WIRING BOARD AND ELECTRONIC EQUIPMENT

(75) Inventor: Yasuhiro Takahashi, Ageo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/840,709

(22) Filed: Aug. 17, 2007

(65) Prior Publication Data

US 2008/0063092 A1  Mar. 13, 2008

(30) Foreign Application Priority Data

Sep. 11, 2006 (JP) ............................. 2006-244981
Aug. 6, 2007 (JP) ............................. 2007-204351

(51) Int. Cl.
*H01R 12/00* (2006.01)

(52) U.S. Cl. ......................................... 439/70; 361/792
(58) Field of Classification Search .................. 439/92; 361/792–795
See application file for complete search history.

(56) References Cited

U.S. PATENT DOCUMENTS 5,912,809 A * 6/1999 Steigerwald et al. ........ 361/780
6,937,480 B2 * 8/2005 Iguchi et al. ................. 361/780
7,176,383 B2 * 2/2007 Lauffer et al. ................ 174/255
7,222,045 B2   5/2007 Kourogi et al. ............. 702/150

FOREIGN PATENT DOCUMENTS

JP        2004-264028        9/2004

* cited by examiner

*Primary Examiner*—Phuong K Dinh
(74) *Attorney, Agent, or Firm*—Fitzpatrick, Cella, Harper & Scinto

(57) ABSTRACT

A printed wiring board, comprising a signal plane having a baseband block for processing a baseband signal and a high-frequency block for processing a high-frequency signal which is obtained by converting the baseband signal, and a ground plane opposing to the signal plane. The baseband block and the high-frequency block are connected through a transmission line for transmitting a signal of a specific frequency region. The ground plane is provided with a first ground portion and a second ground portion, the first ground portion being provided at an area opposing to the baseband block, the second ground portion being provided at an area opposing to the high-frequency block. The first ground portion and the second ground portion are coupled to each other through a coupling portion provided therebetween which has a low impedance with respect to the signal of the specific frequency region.

7 Claims, 8 Drawing Sheets

US 7,438,560 B2

PRINTED WIRING BOARD AND ELECTRONIC EQUIPMENT

BACKGROUND OF THE INVENTION

1. Field of the Invention

The present invention relates to a printed wiring board and electronic equipment capable of solving a problem of interference which takes place within the electronic equipment, in which electromagnetic waves generated by the electronic equipment affect the performance of the electronic equipment itself.

2. Description of the Related Art

In recent years, digital peripheral devices such as a digital camera or a printer are widespread, and personal computers or peripheral devices are connected to each other. Under such circumstances, a device, such as a digital camera and a printer, which has a built-in radio portion and enables connection to the peripheral device through a wireless interface is on the rise.

FIG. 10 is a schematic diagram for explaining a structure of a digital camera having a radio portion incorporated therein. A printed wiring board 140 used for a digital camera is generally formed of two blocks including a camera portion 141 and a radio portion 142. The camera portion 141 constitutes a baseband block, which is driven by a baseband signal of a frequency equal to or less than a sampling frequency necessary for subjecting an image to digital signal processing. The sampling frequency is twice or more as high as the frequency band of the image. For example, it is known as a sampling theorem to use a sampling clock of 16 MHz or higher with respect to a baseband signal having a frequency band of 8 MHz. The radio portion 142 constitutes a high-frequency block which is driven in a frequency band which is used in using a general radio LAN. In general, a frequency band of 2.4 to 2.5 GHz is used.

The camera portion 141 operates based on a clock signal 143, and processing and operation are performed based on the clock signal 143. An image taken by a CCD 145 is sent to a CPU portion 144 through a CCD interface 146 where the image is subjected to digital processing. The processed image is stored in an internal memory (not shown), or in a removable memory card or the like (not shown). An LCD 147, which displays a subject on a monitor screen and indicates various information on the subject, displays the image taken by the CPU portion 144 and various setting information, through an LCD controller 148. Further, a modulation/demodulation processing portion 149 is connected to the CPU portion 144, and signals from the CPU portion 144 are converted into a frequency band used for radio communication. The signals which are converted into a radio frequency band are connected to the radio portion 142 through an interface 153.

The radio portion 142 amplifies high-frequency signals, which are transmitted from the modulation/demodulation processing portion 149 through the interface 153, through a power amplifier 150 for transmission, and transmits the amplified signals as radio signals from an antenna 152. Also, the radio signals received through the antenna 152 are amplified through a low noise amplifier 151 for reception, and transmitted to the modulation/demodulation processing portion 149 through the interface 153.

In the case of a digital camera structured as described above, the camera portion 141 operates based on a high-speed clock signal having a large amplitude. Accordingly, a noise component including many higher harmonic waves is mixed in a power source and a ground of the camera portion 141. Each IC of the camera portion 141 uses digital signals, and each portion operates in synchronization with the clock. For this reason, such noise component leads to a malfunction of each IC. Also, those high-frequency signals are radiated as a radiation noise into space by a conductor such as a ground, which also results in a factor that causes a malfunction.

On the other hand, signals which are exchanged at the interface 153 in a radio frequency band and signals received by the antenna 152 are analog signals which are extremely small in amplitude. For this reason, when the above-mentioned noise component is mixed in the power amplifier 150 of the radio portion 142, a distortion component is generated in an output of the power amplifier 150 due to the nonlinearity of the input/output characteristic of the power amplifier 150. In particular, when an odd-order distortion is generated in the vicinity of the transmission frequency, a spurious noise is transmitted. Further, when the noise component is mixed in the low noise amplifier 151, a spurious noise which is outside of the desired frequency band is received. Also, when the noise component large in amplitude is input to the low noise amplifier 151, the low noise amplifier is saturated, leading to deterioration in reception sensitivity.

For those reasons as described above, in a printed wiring board which is provided with both a baseband block such as the camera portion 141 and a high-frequency block such as the radio portion 142, it is necessary to prevent the two blocks from being coupled to each other in space. In view of the above, there has been proposed to provide a shield case to the high-frequency portion or to separate the power sources and the grounds of the two blocks.

Also, Japanese Patent Application Laid-Open No. 2004-264028 has proposed a technology of preventing reception sensitivity from being deteriorated by a clock signal or the like generated within a radio device.

As described above, when the high-frequency block is covered with the shield case, it is possible to efficiently confine, in particular, a high-level electric field radiated from the power amplifier, to thereby suppress the electric field from interfering with the baseband portion. Also, it is possible to prevent a situation where a clock signal radiated from the baseband portion and higher harmonic waves thereof hinder the reception of faint signals in the low noise amplifier. In other words, the shield case functions effectively with respect to the coupling in space.

Further, with the structure in which the power sources and the grounds of the baseband block and the high-frequency block are electrically separated from each other, a fluctuation occurring in the power source or in the ground of one of the blocks is not transmitted to the other block, to thereby reduce interference occurring through the conductor.

However, according to the above-mentioned interference prevention method, the grounds of the blocks are disconnected from each other, and a return path cannot be formed on the printed wiring board for a signal transmitted through the interface.

FIG. 11 is a schematic diagram illustrating a printed wiring board 131 in which grounds of two blocks are separated from each other. On a top surface of the printed wiring board 131, there are provided a baseband portion 132 and a high-frequency portion 133. The base band portion 132 and the high-frequency portion 133 are connected to each other through a transmission line 136 which functions as an interface. Meanwhile, an undersurface of the printed wiring board 131 is provided with a ground plane 134 and a ground plane 135, the ground plane 134 and the ground plane 135 being separated from each other. The ground plane 134 includes a power source system of the baseband portion 132, and the ground plane 135 includes a power source system of the high-frequency portion 133.

With the above-mentioned structure, the baseband portion 132 is provided close to the ground plane 134, and the baseband portion 133 is provided close to the ground plane 135. In this manner, the closed signal circuits in each of the blocks function satisfactorily. Also, the grounds of the blocks are separated from each other, and therefore interference through the power source and the ground can be reduced. However, the transmission line 136 connecting the blocks to each other does not have a suitable ground plane corresponding thereto, and a return path cannot be formed via a minimal route. For this reason, signals that should be transmitted through the transmission line 136 may be extremely deteriorated in quality, or the signals may not be transmitted in the worst case.

In other words, in the printed wiring board 131 incorporated in electronic equipment, the grounds of the blocks are connected to the frame ground 137 which is generally formed of a casing or the like, but the grounds do not form a satisfactory return path with respect to the above-mentioned interface. The above-mentioned two blocks are connected to the power source of the electronic device to form a long path, which does not serve as an effective return path, either.

Japanese Patent Application Laid-Open No. 2004-264028 proposes a technology of preventing reception sensitivity from being deteriorated by a clock signal or the like generated within a radio device. However, this technology removes higher harmonic waves of the clock falling into a receiving frequency band, and is not capable of dealing with an interference secondarily occurring in the radio portion. Also, it is impossible to prevent a spurious noise secondarily generated in the transmitting portion.

SUMMARY OF THE INVENTION

It is an object of the present invention to provide a printed wiring board and electronic equipment capable of reducing an influence of a noise signal occurring between a baseband portion and a high-frequency portion and also capable of suppressing a radiation noise, to thereby maintain the quality of signals transmitted through an interface.

A printed wiring board according to the present invention includes: a signal plane having a baseband block for processing a baseband signal and a high-frequency block for processing a high-frequency signal which is obtained by converting the baseband signal; and a ground plane opposing to the signal plane, in which: the baseband block and the high-frequency block are connected through a transmission line for transmitting a signal of a specific frequency region; the ground plane is provided with a first ground portion and a second ground portion, the first ground portion being provided at an area opposing to the baseband block, the second ground portion being provided at an area opposing to the high-frequency block; and the first ground portion and the second ground portion are coupled to each other through a coupling portion provided therebetween which has a low impedance with respect to the signal of specific frequency region.

According to the present invention, grounds and power sources corresponding to the baseband block and the high-frequency block of the electronic equipment or the like are separated from each other, and a return path for interface signals can be formed via a minimum route, to thereby realize a printed wiring board having a stable interface function capable of suppressing a mutual interference between the baseband block and the high-frequency block.

Accordingly, it is possible to prevent noise contamination and intermodulation distortion, to thereby reduce a spurious noise. In addition, the present invention produces an effect of reducing EMI such as casing radiation. Also, it is possible to prevent a clock signal from entering the receiving portion, to thereby produce an effect to prevent the sensitivity from being suppressed and to reduce a spurious noise.

Further features of the present invention will become apparent from the following description of exemplary embodiments with reference to the attached drawings.

DESCRIPTION OF THE EMBODIMENTS

Exemplary embodiments for implementing the present invention are described with reference to the accompanying drawings.

First Embodiment

Figure 1:
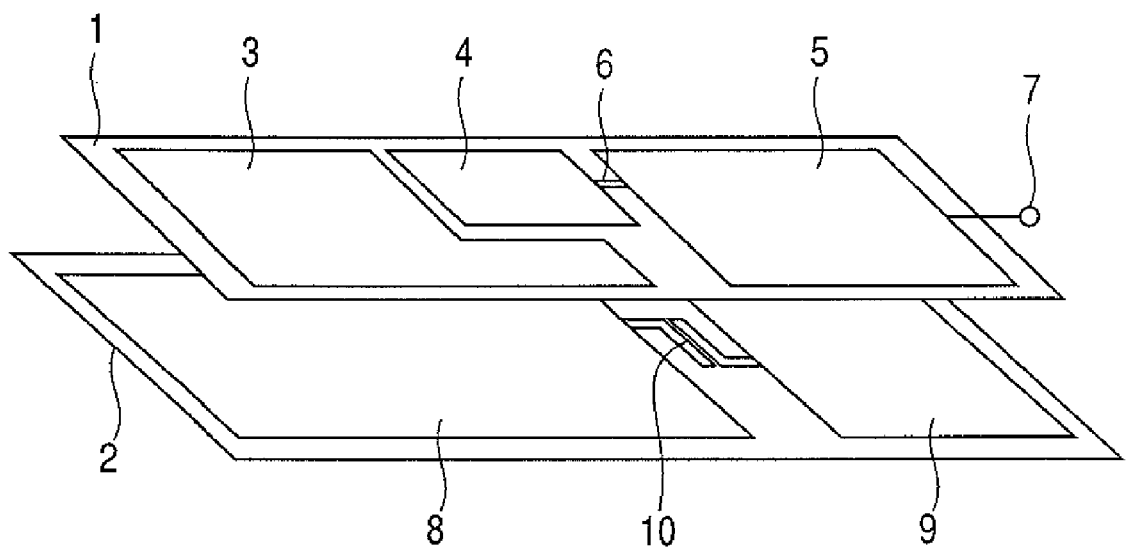
FIG. 1 is a schematic diagram illustrating a first Embodiment of the present invention.

FIG. 1 is a schematic diagram for describing a structure of a printed wiring board, according to the present invention, of a digital camera having a built-in radio portion. A signal plane 1 has two blocks including a baseband block and a high-frequency block formed thereon. The baseband block includes a baseband signal processing portion 3 and a modulation/demodulation processing portion 4 which are electrically connected to each other. The high-frequency block includes a power amplifier 5. The modulation/demodulation processing portion 4 and the power amplifier 5 are connected to each other through a transmission line 6 which is an interface.

The baseband signal processing portion 3 has functions of executing digital signal processing on image information obtained with a CCD camera or the like, storing the image information, and outputting the image information. The baseband signal processing portion 3 generally performs operation and processing in synchronization with a high-speed clock signal, and therefore there are a large number of signals present in the baseband processing portion 3, the signals having amplitudes significantly larger than those of signals handled by the modulation/demodulation processing portion 4.

On the other hand, in a case of radio transmission of an image taken by a camera, the image is converted by the modulation/demodulation processing portion 4 into signals (interface signals) having transmission frequencies. The signals converted into the transmission frequency band are connected to the power amplifier 5 through the transmission line 6, where the signals are subjected to power amplification so as to have enough power for transmission, and introduced to an antenna output 7 to be emitted into space. At this time, in general, the power amplifier 5 operates under Class-A operation or Class-B operation in view of power efficiency, or operates under Class-C operation of nonlinear amplification in a case of a modulation method in which the amplitude carries no information.

There is also provided a ground plane 2, which is opposed to the signal plane 1. The ground plane 2 is provided with a first ground portion 8 as opposed to the baseband block including the baseband signal processing portion 3 and the modulation/demodulation processing portion 4. The ground plane 2 is also provided with a second ground portion 9 as opposed to the high-frequency block including the power amplifier 5. The first ground portion 8 and the second ground portion 9 are coupled to each other through a coupling portion 10 which has a low impedance with respect to the frequency band of the interface signals. The coupling portion 10 is formed of a plurality of conductor patterns in which two conductors respectively connected to the first ground portion 8 and the second ground portion 9 are arranged in parallel with each other. This structure shows a low impedance only for signals of specific frequencies to enables transmittance of the signals, even though the first ground portion 8 and the second ground portion 9 are physically separated from each other.

Figure 2:
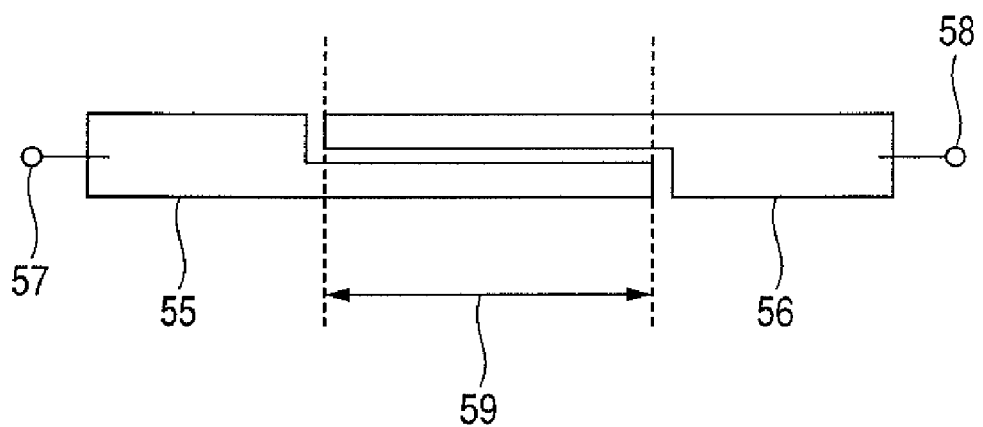
FIG. 2 is a detailed diagram for describing a coupling portion of the first Embodiment of the present invention.

FIG. 2 is a detailed diagram for describing the coupling portion 10. A first conductor pattern 55 is connected to the first ground portion 8 through a terminal 57, and a second conductor pattern 56 is connected to the second ground portion 9 through a terminal 58. The first conductor pattern 55 and the second conductor pattern 56 are arranged so as to be in parallel with each other in an area 59. With this structure, only signals in a specific frequency region are electrically coupled. Specifically, in a case of a signal having a wavelength of $\lambda$, the area 59 is set to have an electrical length of $\lambda/4$ or an odd multiple thereof, to thereby set the coupling portion to be low impedance, so that the maximum electrical coupling of the first conductor pattern 55 and the second conductor pattern 56 can be obtained. In other words, the terminal 57 and the terminal 58 are connected to the ground planes 19 and 20 located directly below the transmission line 6, respectively, to thereby form a return path with respect to a frequency region of signals transmitted through the transmission line 6.

Figure 3:
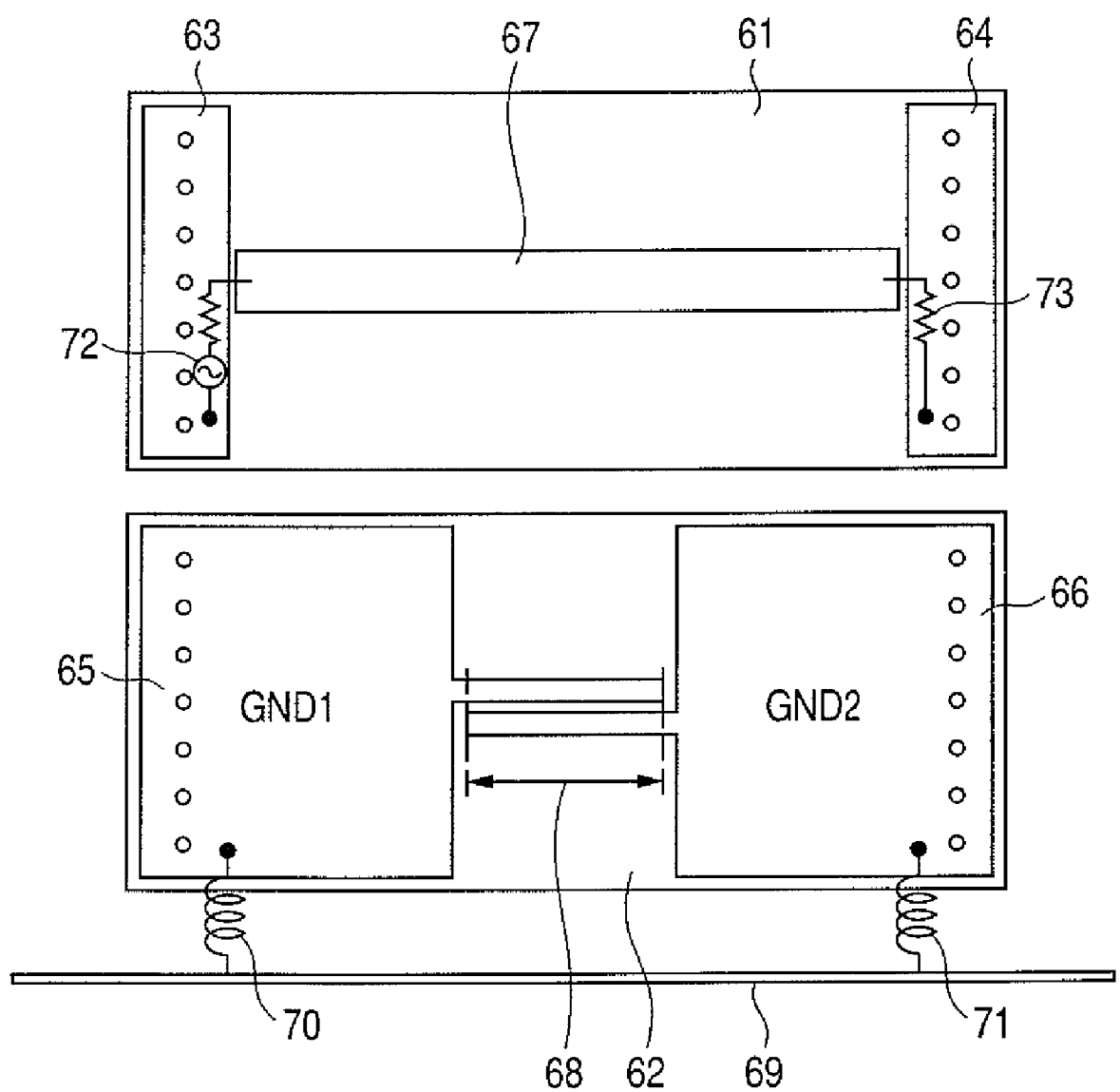
FIG. 3 is a schematic diagram illustrating a structure of a device for performing a transmission characteristic test on a transmission line.

FIG. 3 is a schematic diagram illustrating a device for performing a transmission characteristic test on the printed wiring board of FIG. 1. It is assumed that the device is electronic equipment. A signal plane 61 is provided with a ground pattern 63 and a ground pattern 64. The ground pattern 63 has a signal source 72 connected thereto, which transmits signals, through a transmission line 67 which is an interface, to a load 73 connected to the ground pattern 64. A ground plane 62 is provided with a first ground portion 65 and a second ground portion 66. The first ground portion 65 is connected to the ground pattern 63 via through holes. The second ground portion 66 is connected to the ground pattern 64 via through holes. The first ground portion 65 and the second ground portion 66 are physically separated from each other, and coupled through a coupling portion formed of two conductor patterns which are arranged in parallel with each other. The length of a parallel area 68 at the coupling portion, where the two conductor patterns are arranged in parallel with each other, is set to $\lambda/4$ of the electrical length at 1.5 GHz (about 23 mm in a case where the coupling portion is formed on a glass-epoxy substrate). A frame ground 69 is formed of a casing, which is connected to the first ground portion 65 through an inductor element 70 and connected to the second ground portion 66 through an inductor element 71.

Figure 4:
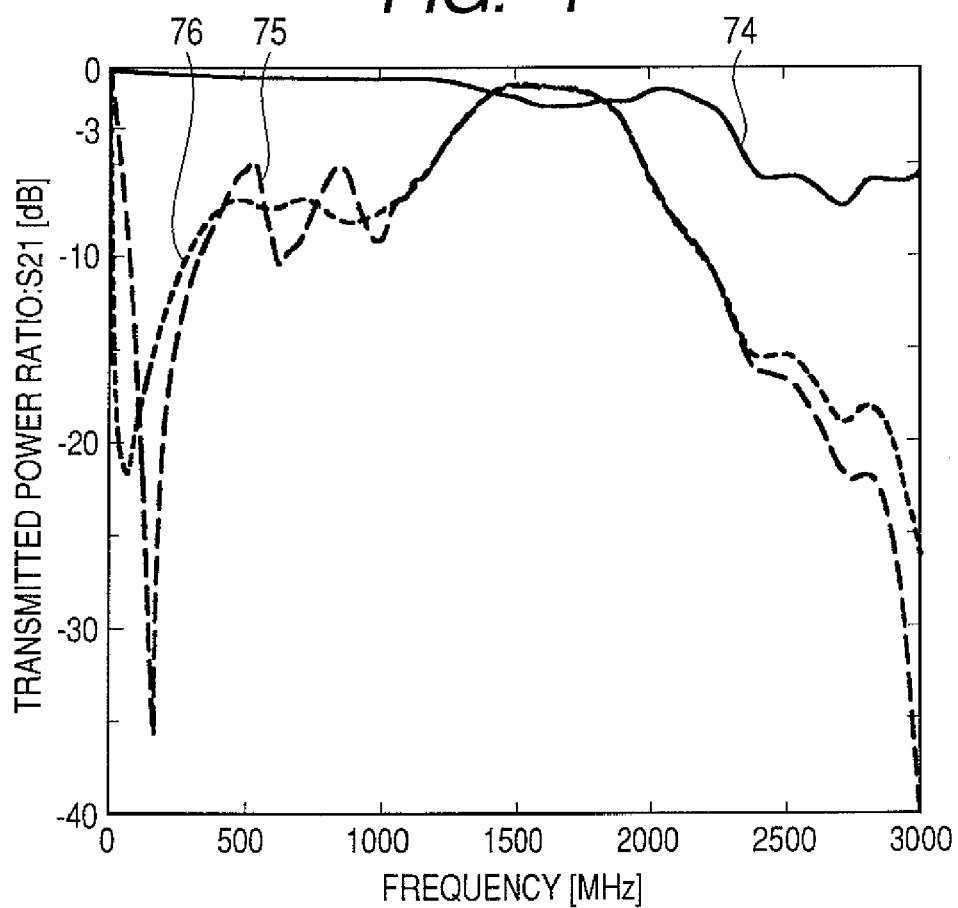
FIG. 4 is a graph illustrating results of the transmission characteristic test performed on a transmission line.

FIG. 4 is a graph illustrating a result obtained by measuring transmission characteristics of the printed wiring board in a case where signals of 0 MHz to 3 GHz are transmitted from the signal source 72 to the load 73. Frequencies of the signals to be transmitted are shown on the abscissa axis and transmitted power ratios (S21 characteristics) are shown on the vertical axis. A solid line 74 indicates a case where the conductive patterns of the coupling portion of FIG. 3 are physically connected. Specifically, the solid line 74 indicates a transmission characteristic of the transmission line 67 obtained in a case where the first ground portion 65 and the second ground portion 66 are not separated from each other. It is understood from the solid line 74 that the transmission line of the signals are formed in a frequency region ranging widely from a low frequency to a high frequency in a case where the ground portions are not separated from each other.

On the other hand, dashed lines 75 and 76 each indicate a transmission characteristic of the printed wiring board obtained in a case where the first ground portion 65 and the second ground portion 66 are separated from each other while being coupled at the coupling portion 68. The dashed line 75 illustrates the characteristic obtained when the grounds and the frame ground are coupled through a short wire which is generally used. On the other hand, the dashed line 76 illustrates the transmission characteristic obtained in a case where an element (inductor) 70 is inserted between the ground 63 and the frame ground 69, and an element (inductor) 71 is inserted between the ground 64 and the frame ground 69.

Based on the obtained results, it is understood that the coupling portion functions as a transmission line with respect to a transmission signal with a frequency of 1.5 GHz. In other words, it is understood that the coupling portion functions as a return path for the transmission signal of 1.5 GHz which is transmitted through the transmission line 67. The return path of the ground is not formed for a transmission signal of other frequency bands than 1.5 GHz. In the present invention, the transmission characteristic (S21 characteristic) is necessary to be −3 db or more for forming the return path, which characteristic is defined as low impedance according to the present invention.

When one intends to positively separate a low frequency component such as a clock signal in a path of a signal system, it may be effective to connect each of the grounds to the frame ground 69 through inductors so as to attain a connection merely for power supply.

Figure 5:
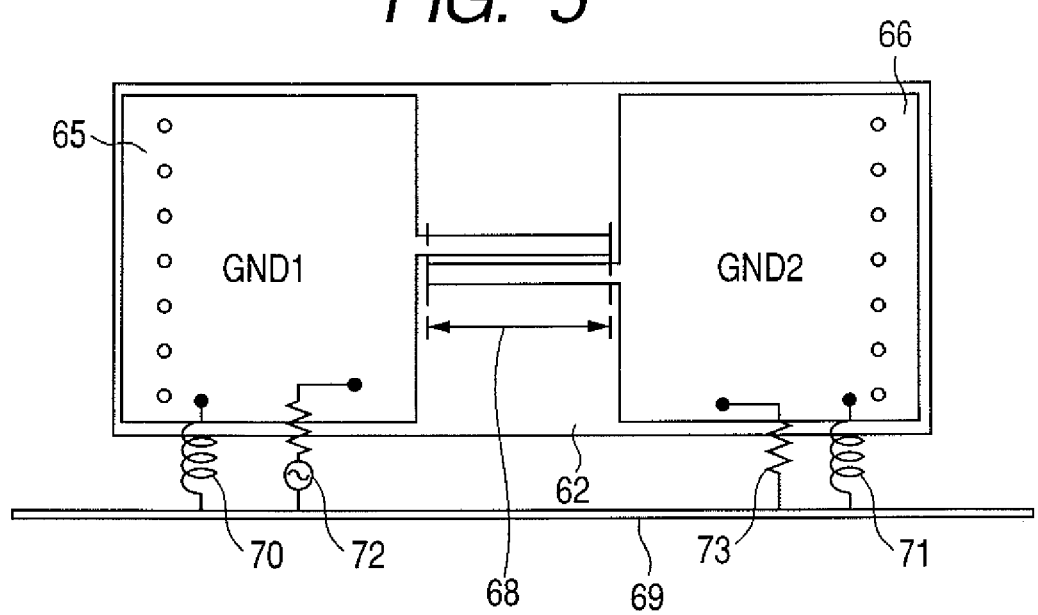
FIG. 5 is a schematic diagram illustrating a structure of a device for performing a transfer characteristic test.

FIG. 5 is a schematic diagram illustrating a device for testing a transfer characteristic between the grounds of the blocks. It is assumed that the device is electronic equipment. In FIG. 5, members similar to those of FIG. 3 are denoted by the same reference numerals and descriptions thereof are omitted. The first ground portion 65 and the second ground portion 66 on the ground plane 62 are connected to the frame ground 69 through the elements 70 and 71 having inductive properties. Examples of elements having inductive properties include a member such as a lead wire, a screw, or a power line, which are connected in a series manner.

Figure 6:
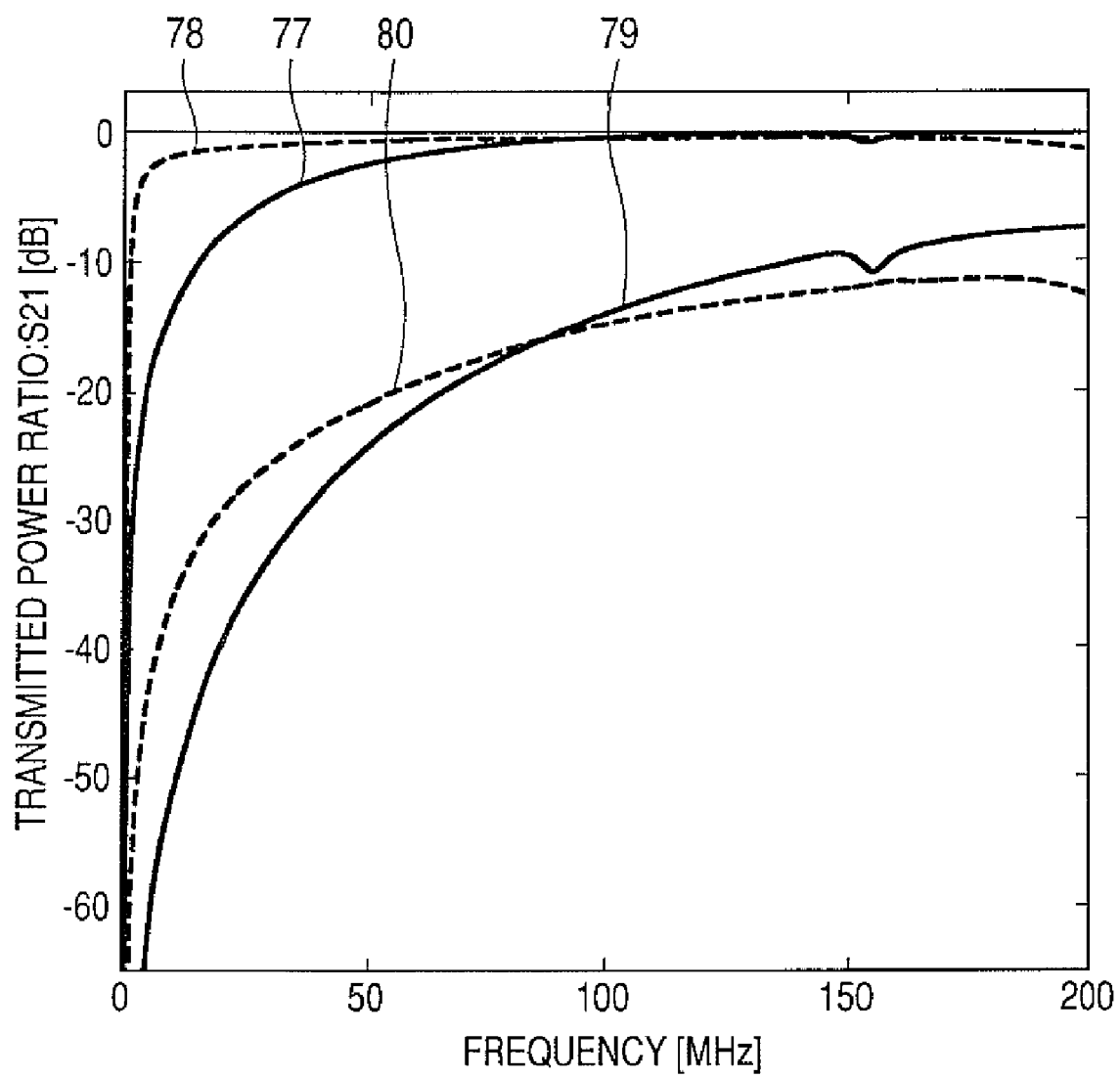
FIG. 6 is a graph illustrating a result of the transfer characteristic test.

FIG. 6 is a graph illustrating a result obtained by measuring transmission characteristics in a case where the signal source 72 is disposed between the first ground portion 65 and the frame ground 69, and the load 73 is disposed between the second ground portion 66 and the frame ground 69. Frequencies of the signals to be transmitted are shown on the abscissa axis and transmitted power ratios (S21 characteristics) are shown on the vertical axis. This transmission characteristic indicates a transmission characteristic between the grounds, and the interference between the grounds is reduced as the transmitted power ratio (S21) decreases.

Graphs 77 and 78 illustrate transmission characteristics obtained when the grounds are physically connected at a coupling section so as not to separate the grounds from each other. The graph 77 (solid line) illustrates a characteristic obtained when the grounds 65 and 66 are each connected to the frame ground 69 through a short wire. The graph 78 (dashed line) illustrates a case where the grounds 65 and 66 are each connected to the frame ground 69 through an inductance element. In any of those cases, high transmission characteristics are exhibited even in a low-frequency band, which means that a low-frequency component such as a clock signal is transmitted through the grounds, to cause interference.

On the other hand, graphs 79 and 80 illustrate characteristics obtained in a case where the grounds are formed as a coupled conductor pattern without being physically connected to each other at the coupling section. The graph 79 (solid line) illustrates a characteristic obtained when the grounds 65 and 66 are each connected to the frame ground 69 through a short wire. The graph 80 (dashed line) illustrates a case where the grounds 65 and 66 are each connected to the frame ground 69 through an inductance element. The characteristics shown by the graphs 79 and 80, which are obtained in a case where the grounds are coupled at the coupling section rather than on the printed wiring board, are significantly attenuated at low frequencies as compared with the characteristics shown by the graphs 77 and 78. In the case where the grounds are formed as a coupled conductor pattern, the transmitted power ratio corresponding to a frequency of about 20 MHz, which is generally used as a base clock, is around −30 dB (power ratio: 1/1000), which means that the interference between the grounds can be significantly reduced.

In recent years, there have been used standards represented by 802.11a, 802.11b, and 802.11g for the above-mentioned radio transmission. Radio frequencies used for those standards are in the 2.4 GHz band and in the 5.6 GHz band. The electrical length λ/4 on the printed wiring board with respect to those frequencies is short to be around 10 to 20 mm on a glass-epoxy substrate for example, and therefore it is easy to form a coupled conductor pattern on the substrate.

Second Embodiment

Figure 7:
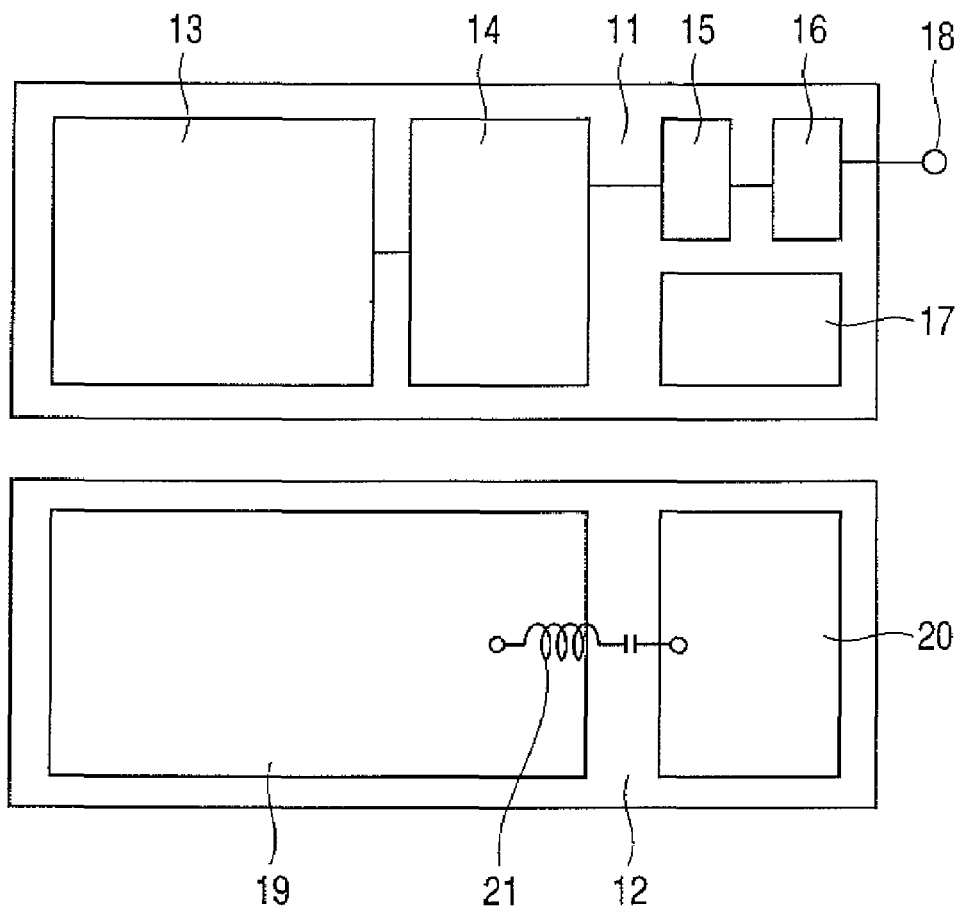
FIG. 7 is a schematic diagram for describing a second Embodiment of the present invention.

FIG. 7 illustrates a second Embodiment of the present invention. This embodiment illustrates a device for receiving an image taken by a digital camera or a digital video and transmitted by radio, and displaying or printing the image.

A printed wiring board according to this embodiment is provided with a signal plane 11 and a ground plane 12 for forming a circuit on both sides thereof. The signal plane 11 includes circuit function blocks and the ground plane 12 includes grounds corresponding to the blocks of the signal plane 11. A radio transmission signal input from a receiving antenna terminal 18 is amplified by a low-noise amplifier 16, and subjected to frequency conversion to have an intermediate frequency at the frequency converting portion 15. At this time, the frequency converting portion 15 is supplied with local signals by a local oscillation circuit 17 for frequency conversion, and arbitrarily selects frequencies of the local signal, to thereby select radio frequencies to be received.

The signal of the intermediate frequency (generally a fixed frequency band) output from the frequency converting portion 15 is amplified, and subjected to frequency conversion and to demodulation processing by a modulation/demodulation processing portion 14, so as to obtain a baseband signal. The baseband signal obtained through the demodulation processing is subjected to signal processing in a baseband signal processing portion 13 constituting a baseband signal processing system block together with the modulation/demodulation processing portion 14, and outputted for any purpose.

In the baseband signal processing portion 13, processing is performed based on a clock signal large in amplitude as in the first Embodiment of the present invention or the like. In a case of a printed wiring board which is provided with both a receiver and the baseband signal processing portion 13, an interfering wave enters the low-noise amplifying portion 16 which handles extremely faint analog signals. There are two types of interference caused by the interfering wave: the interfering wave may directly interfere with the receiving antenna terminal 18, or may cause interference in the device. An extraneous wave entering through the receiving antenna terminal 18 can be removed to some extent by using a shield such as a cable or a reception band-pass filter provided to the receiver input terminal.

Figure 8:
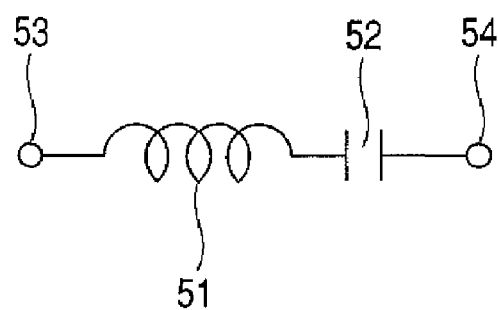
FIG. 8 is a detailed diagram for describing a coupling portion of the second Embodiment of the present invention.

A first ground portion 19 and a second ground portion 20 are coupled through a series resonance circuit 21 which is formed of a lumped (constant) element including an inductance element and a capacitance element. With this structure, a wiring having a low impedance with respect to a specific frequency can be attained. FIG. 8 illustrates the series resonance circuit 21 formed of a lumped (constant) element including an inductance 51 and a capacitance 52. The series resonance circuit 21 has a minimum impedance between a terminal 53 and a terminal 54 at an angular frequency which establishes a relation of complex conjugation between a reactance XL (XL=jωL) of the inductance 51 and a reactance XC (XC=1/jωC) of the capacitance 52.

The angular frequency $\omega_0$ is expressed by the following expression.

$$\omega_0 = (L \times C)^{-1/2}$$

Directly below the transmission line 6, the terminal 53 is connected to the first ground portion 8 and the terminal 54 is connected to the second ground portion 9. With this structure, a return path can be formed with respect to the transmission frequency band.

In general, the power source plane is formed to be at the same potential as the ground plane and a high-frequency wave (transmission frequency). Accordingly, in a case where the power source plane is provided as a multilayer board, power source planes may be coupled together, or used in combination with one another.

Figure 9:
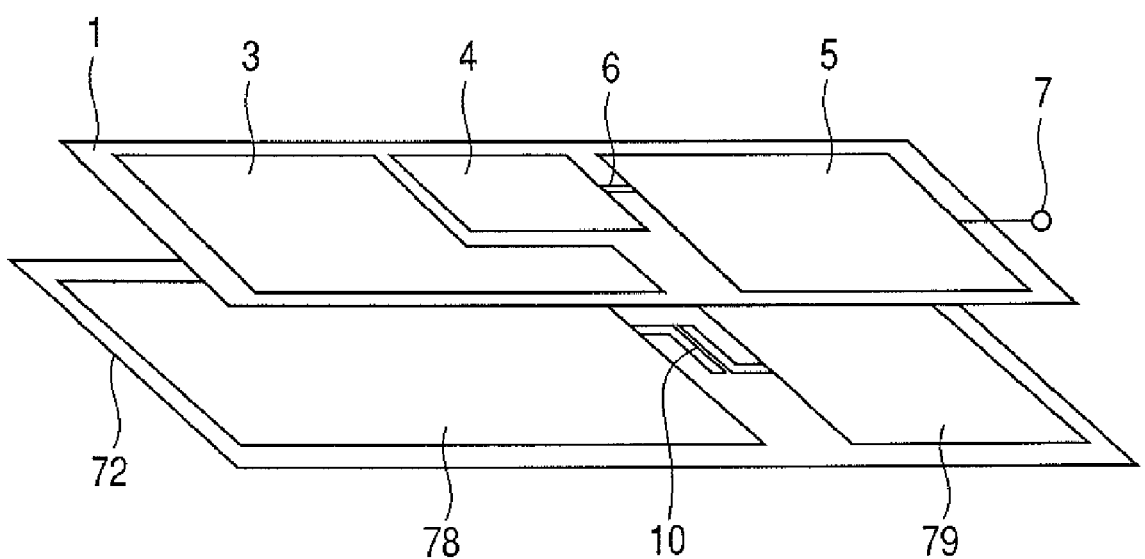
FIG. 9 is a schematic diagram illustrating another embodiment.
Figure 10:
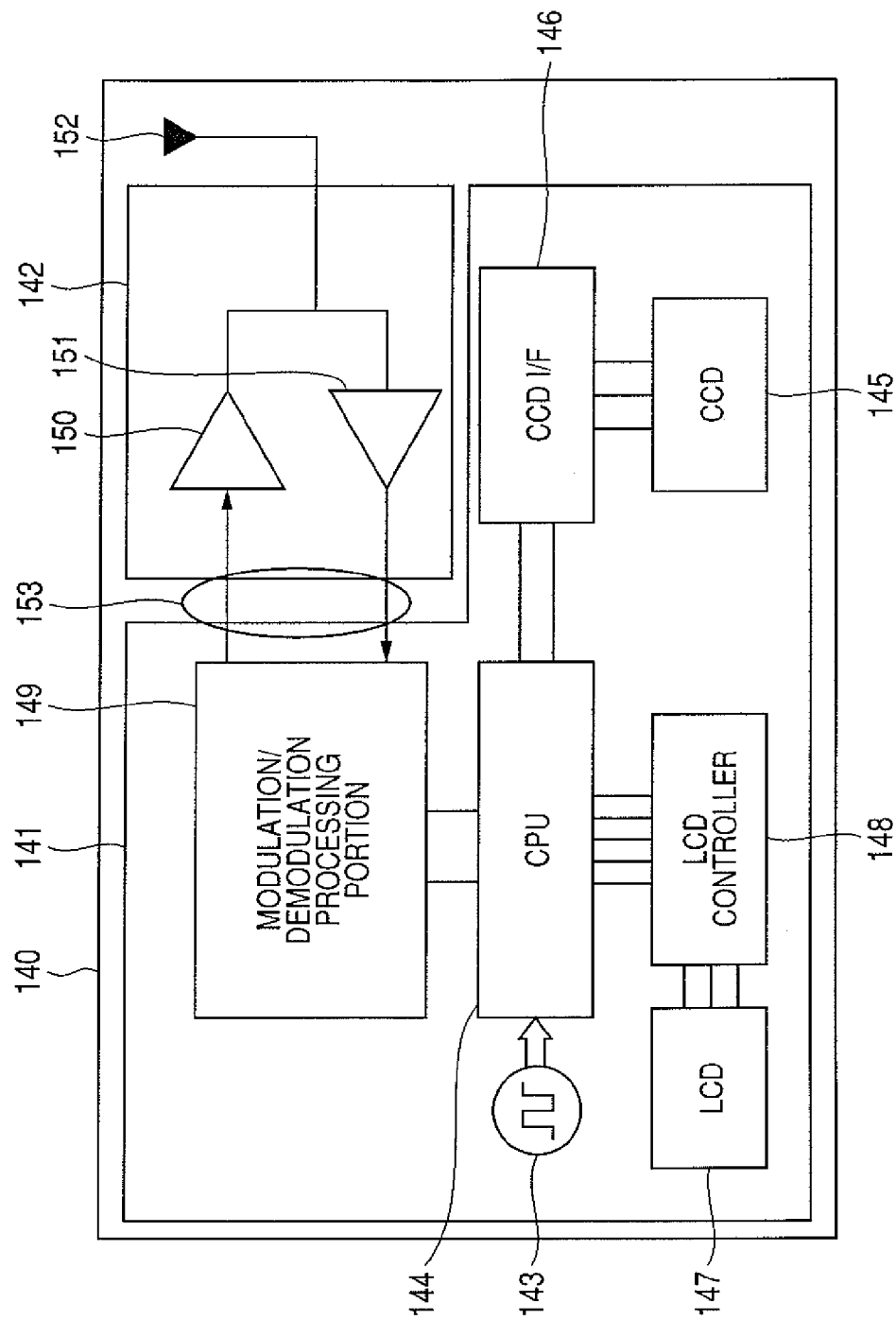
FIG. 10 is a schematic diagram illustrating a structure of a conventional printed wiring board for a digital camera.
Figure 11:
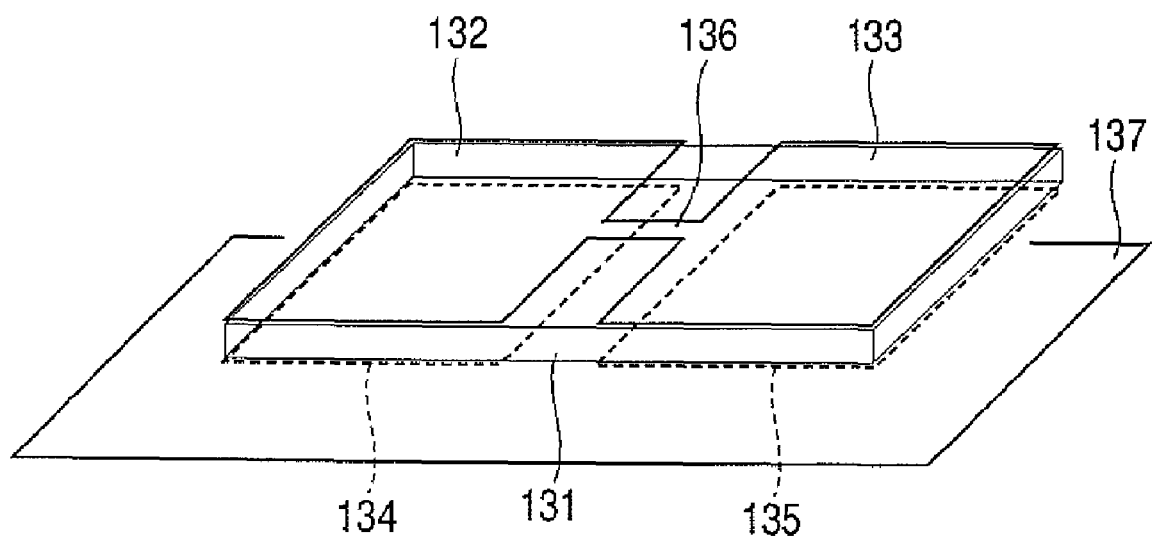
FIG. 11 is a schematic diagram for describing a structure of a conventional printed wiring board.

Note that the ground plane 2 or 12 illustrated in FIG. 1 or 7 may be replaced by a power source plane 72 as illustrated in FIG. 9. FIG. 9 is different from FIG. 1 or 7 in that a first power source portion 78 is provided in place of the first ground portion 8 or 19, and a second power source portion 79 is provided in place of the second ground portion 9 or 20. An embodiment shown in FIG. 9 exhibits signal characteristics substantially the same as those obtained in Embodiments of FIGS. 1 and 7.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2006-244981, filed Sep. 11, 2006, and 2007-204351, filed Aug. 6, 2007, which are hereby incorporated by reference herein in their entirety.

What is claimed is:

1. A printed wiring board, comprising:
   a signal plane having a baseband block for processing a baseband signal and a high-frequency block for processing a high-frequency signal which is obtained by converting the baseband signal; and
   a ground plane opposing to the signal plane,
   wherein the baseband block and the high-frequency block are connected through a transmission line for transmitting a signal of a specific frequency region;
   wherein the ground plane is provided with a first ground portion and a second ground portion, the first ground portion being provided at an area opposing to the baseband block, the second ground portion being provided at an area opposing to the high-frequency block; and
   wherein the first ground portion and the second ground portion are coupled to each other through a coupling portion provided therebetween which has a low impedance with respect to the signal of the specific frequency region.

2. A printed wiring board according to claim 1,
   wherein the coupling portion is provided directly below the transmission line and has a structure in which a first conductor pattern connected to the first ground portion and a second conductor pattern connected to the second ground portion are arranged in parallel with each other, the first ground portion and the second ground portion being physically separated from each other; and
   wherein the parallel arrangement area of the first conductor pattern and the second conductor pattern has a length of an electrical length of one of ¼ of the wavelength of the signal of the specific frequency region and an odd multiple thereof.

3. A printed wiring board according to claim 1, wherein the coupling portion is provided directly below the transmission line and comprises a series resonance circuit having an inductance element and a capacitance element connecting the first ground portion and the second ground portion.

4. Electronic equipment, comprising the printed wiring board according to claim 1 and a casing to which the printed wiring board is fixed, wherein the first ground portion and the second ground portion are connected to the casing through an inductance element.

5. A printed wiring board, comprising:
   a signal plane having a baseband block for processing a baseband signal and a high-frequency block for processing a high-frequency signal which is obtained by converting the baseband signal; and
   a power source plane opposing to the signal plane,
   wherein the baseband block and the high-frequency block are connected through a transmission line for transmitting a signal of a specific frequency region;
   wherein the power source plane is provided with a first power source portion and a second power source portion, the first power source portion being provided at an area opposing to the baseband block, the second power source portion being provided at an area opposing to the high-frequency block; and
   wherein the first power source portion and the second power source portion are coupled to each other through a coupling portion provided therebetween which has a low impedance with respect to the signal of the specific frequency region.

6. A printed wiring board according to claim 5,
   wherein the coupling portion is provided directly below the transmission line and has a structure in which a first conductor pattern connected to the first power source portion and a second conductor pattern connected to the second power source portion are arranged in parallel with each other, the first power source portion and the second power source portion being physically separated from each other; and
   wherein the parallel arrangement area of the first conductor pattern and the second conductor pattern has a length of an electrical length of one of ¼ of the wavelength of the signal of the specific frequency region and an odd multiple thereof.

7. A printed wiring board according to claim 5, wherein the coupling portion is provided directly below the transmission line and comprises a series resonance circuit having an inductance element and a capacitance element connecting the first power source portion and a second power source portion.

* * * * *